United States Patent [19]
Roth et al.

[11] Patent Number: 4,963,830
[45] Date of Patent: Oct. 16, 1990

[54] PORTABLE IMPEDANCE METER FOR RESISTANCE WELDING EQUIPMENT

[75] Inventors: Dietrich K. Roth, Walker; Kurt A. Hofman, Wyoming, both of Mich.

[73] Assignee: RoMan Manufacturing, Inc., Grand Rapids, Mich.

[21] Appl. No.: 381,955

[22] Filed: Jul. 19, 1989

[51] Int. Cl.$^5$ .................. G01R 27/08; G01R 27/16
[52] U.S. Cl. .................. 324/715; 324/714; 324/713; 324/724; 219/109
[58] Field of Search ............. 324/649, 691, 693, 713, 324/714, 715, 722–724; 219/109, 110, 117.1

[56] References Cited

U.S. PATENT DOCUMENTS

| | | | |
|---|---|---|---|
| 2,740,044 | 3/1956 | Storm | 250/27 |
| 3,334,297 | 8/1967 | Pfaelzer et al. | 219/109 |
| 3,335,258 | 8/1967 | Barnhart et al. | 219/110 |
| 3,389,239 | 6/1968 | Treppa et al. | 219/110 |
| 4,001,540 | 1/1977 | Drake et al. | 219/110 |
| 4,024,371 | 5/1977 | Drake | 219/110 |
| 4,254,323 | 3/1981 | Takamatsu et al. | 219/110 |
| 4,302,653 | 11/1981 | Denning et al. | 219/110 |
| 4,343,980 | 8/1982 | Stanya et al. | 219/110 |
| 4,387,289 | 6/1983 | Nakata et al. | 219/110 |
| 4,388,515 | 6/1983 | Mathews | 219/110 |
| 4,408,114 | 10/1983 | Nakata et al. | 219/110 |
| 4,434,351 | 2/1984 | Nakata et al. | 219/117.1 |
| 4,442,337 | 4/1984 | Nakata et al. | 219/117.1 |
| 4,521,665 | 6/1985 | Nakata et al. | 219/117.1 |
| 4,542,277 | 9/1985 | Cecil | 219/109 |
| 4,698,584 | 10/1987 | Morin | 324/62 |

Primary Examiner—Reinhard J. Eisenzopf
Assistant Examiner—Jack B. Harvey
Attorney, Agent, or Firm—Warner, Norcross & Judd

[57] ABSTRACT

A portable meter for measuring the impedance of a resistance welding circuit between first and second points on the apparatus. The meter is powered by conventional alternating current and conducts a test alternating current through the welding apparatus at such an amperage so that the voltage measured between the first and second points is equal to the impedance therebetween.

16 Claims, 2 Drawing Sheets

PORTABLE IMPEDANCE METER FOR RESISTANCE WELDING EQUIPMENT

BACKGROUND OF THE INVENTION

The present invention relates to resistance welding equipment, and more particularly to a portable meter for determining the impedance between two points of a resistance welding device.

In resistance welding, coalescence is produced primarily by resistive heat created by passing an electric current through the work-piece. A resistance welder includes primary conductors, a transformer, secondary conductors, and welding electrodes or tips. The primary conductors couple the transformer to a power source. The secondary conductors interconnect the transformer and the electrodes.

Manufacturers of resistance welding transformers are frequently required to specify a transformer required to weld two given pieces of material together. The choice of a transformer is determined by the secondary voltage required to drive the necessary weld current through the welding circuit. The required weld current, along with other data such as weld force, weld time, and the like, to make the weld can be determined from weld schedules published by the American Welding Society (AWS) and the Resistance Welding Manufacturers Association (RWMA). With the required weld current known, the impedance of the welding circuit must be determined to calculate the necessary voltage using Ohm's Law.

The impedance of the welding circuit is the geometric sum of all resistances and reactances in the welding circuit. Calculation of these values is difficult since conductor cross-sections, conductor materials, current path lengths, and the geometry of the weld circuits are not readily defined in mathematical terms. The measurement of impedance in resistance welding circuits has been practiced for many years but requires cumbersome equipment, extensive instrumentation, and in-depth knowledge of electrical engineering.

SUMMARY OF THE INVENTION

The aforementioned problems are overcome in the present invention comprising a portable meter for quickly and simply determining the impedance of resistance welding equipment. The impedance meter is specifically designed for resistance welding applications. The principle of operation is based on a variable low voltage 60-hertz power source capable of driving an adequate current through the impedance of the weld circuit to measure voltage of the circuit under test. The adjustment of the set point of the current level to a known value produces a voltage which is a direct measure of the impedance without further calculation.

In a preferred embodiment, the invention includes a current meter and a manually controllable electrical component enabling the user to adjust the test current to the predetermined value. Further preferably, the test amperage is $10^k$ where k is any integer—negative, zero, or positive. Consequently, the impedance can be read directly from the volt meter included in the invention. Most preferably, the test current is 100 amps, which yields stable results.

These and other objects, advantages, and features of the invention will be more readily understood and appreciated by reference to the detailed description of the preferred embodiment and the drawings.

DETAILED DESCRIPTION OF THE PREFERRED EMBODIMENT

Figure 1:
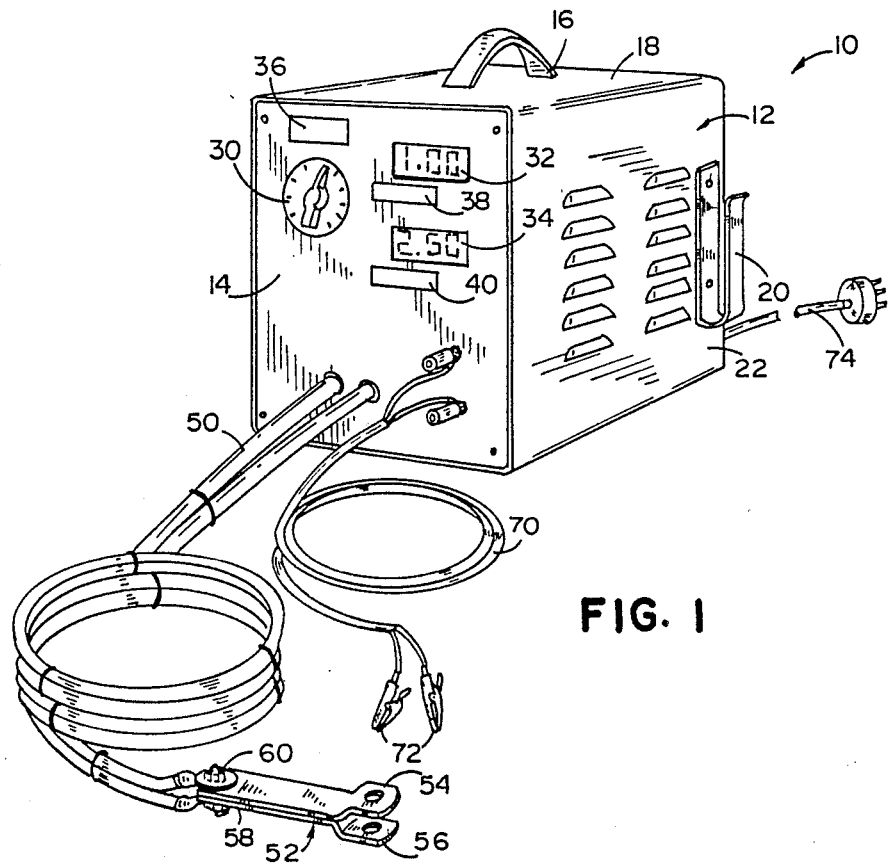
FIG. 1 is a perspective view of the impedance meter of the present invention.
Figure 2:
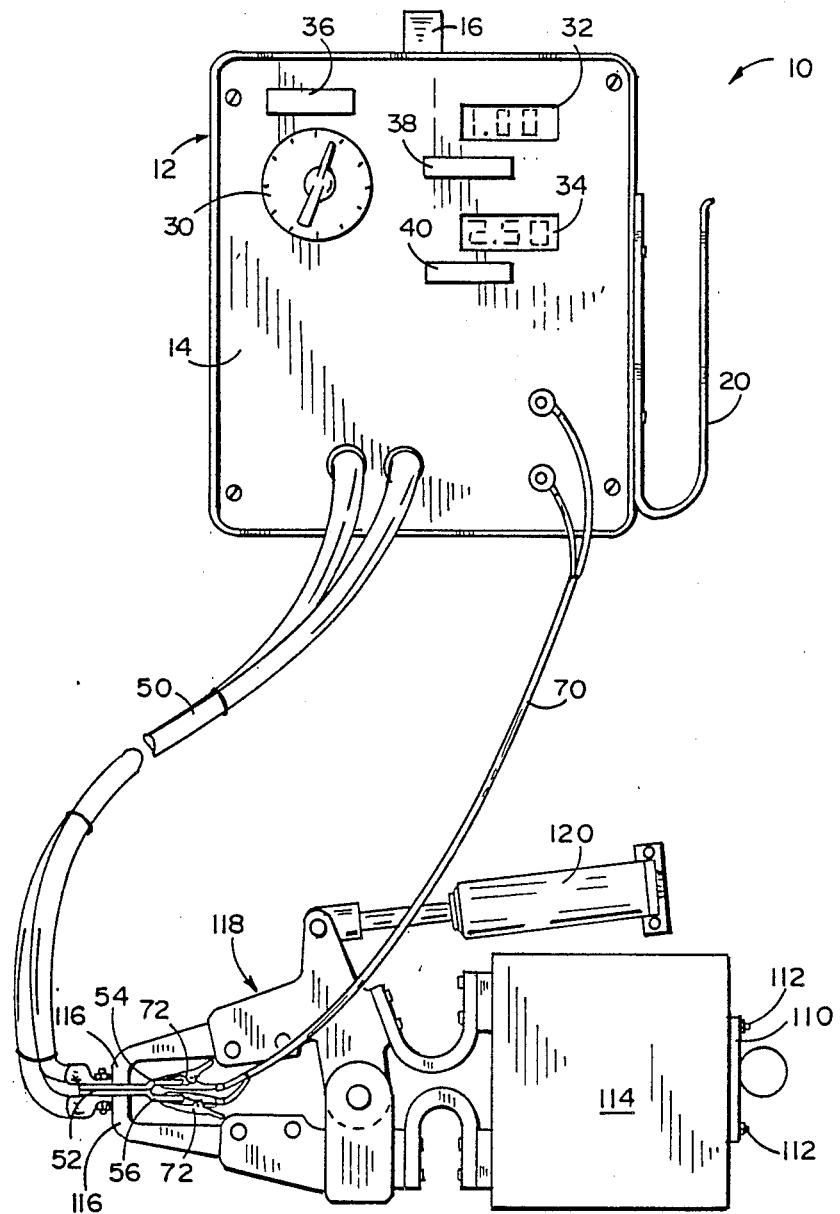
FIG. 2 is a front elevational view of the impedance meter in use to test the impedance of a resistance welding gun and transformer.

A portable impedance meter constructed in accordance with a preferred aspect of the invention is illustrated in FIGS. 1 and 2 and generally designated 10. As seen in FIG. 1, the meter includes a case 12 in the form of a rectangular parallelopiped having a rectangular face 14. A handle 16 is mounted in the top 18 of the case 12; and a cable hanger 20 is mounted on the side 22 of the case 12. When the case is not in use, the cables are preferably coiled and positioned within the hanger 20; and the meter is transported by grasping the handle 16.

The face 14 (FIGS. 1 and 2) includes a dial 30, a current meter display 32, a voltage meter display 34, and three plaques 36, 38, and 40. The dial 30 is a rotary dial connected to a variac as will be described and calibrated between 0 and 100. The current meter display 32 is a digital display including three digits and a decimal point so as to be capable of displaying numbers between 0.00 and 9.99. The voltage meter display 34 is also digital including four digits so as to be capable of displaying the numbers 0 to 9999. The plaques 36, 38, and 40 read "Set-Point Adjustment", "Set-Point", and "Micro-Ohms", respectively.

A pair of current leads 50 extends from the face 14 to conduct the test alternating current as will be described. In the preferred embodiment, the leads 50 are each six feet long and fabricated of #2 AWG extra flexible cable. A connector clip 52 is connected to the leads and includes a pair of opposite bus bars or current adaptors 54 and 56 separated by an insulator 58. An insulated bolt 60 extends through the connector clip 52 to connect the cables 50 to the connector clip and to retain the connector clip components sandwiched together.

A pair of voltage leads 70 also extends from the face 14 of the meter. In the preferred embodiment, the voltage leads are six feet long and fabricated of two-conductor #18 AWG SJ cord with alligator clips 72.

A power cord 74 (see FIG. 1) extends from the rear of the meter (not specifically shown) enabling the meter to be connected to a conventional source of alternating current.

Figure 3:
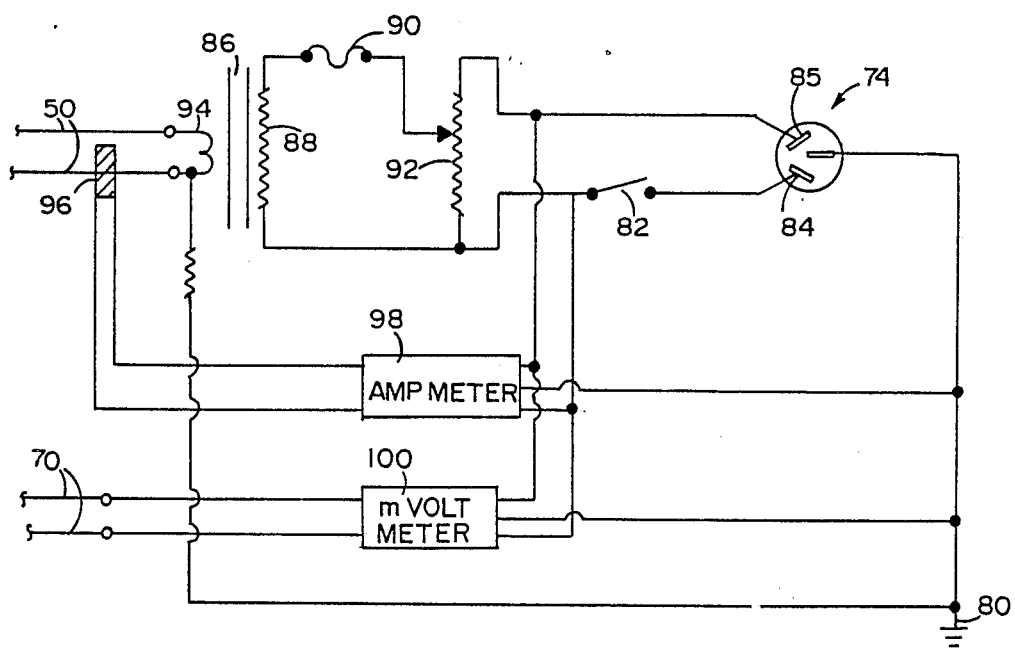
FIG. 3 is a schematic diagram of the impedance meter.

FIG. 3 is a schematic diagram of the meter 10. The power cord 74 is preferably a three conductor cord to protect against shock with one of the three conductors electrically connected to ground 80. The cord includes a plug enabling the cord to be connected to a conventional source of 120-volt alternating current. An on/off switch 82 is electrically connected in series with one of the power conductors 84 of the cord 74 and is mounted in the back of the case to be accessible to a user.

A power transformer 86 is provided with the proper turn ratio. In the preferred embodiment, this ratio is 216 to 1. The primary coil 88 is electrically connected to the conductor 84 through the switch 82; and to the neutral wire 85 through a protection fuse 90 and a variac 92.

The variac is directly connected to the set point dial 30 (see FIGS. 1 and 2) to be manually adjusted by rotation of the dial. The protection fuse 90 is preferably a one-amp fuse but can be any value as required by the meter. The transformer secondary coil 94 is electrically connected to the current leads 50 (see also FIGS. 1 and 2). Consequently, the meter 10 converts 120-volt, 60-Hz, alternating current to 600-millivolt (max), 60-Hz, 250 amp (max) alternating current (with the current leads 50 short-circuited).

A current transformer 96 is mounted about one of the current leads 50 and is electrically connected to the amp meter 98 whose digital display displaying hundreds of amps 32 is illustrated in FIGS. 1 and 2. A voltage meter 100 is electrically connected to the voltage leads 70 and includes a digital display displaying millivolts 34 again shown in FIGS. 1 and 2.

Operation

The impedance meter 10 can be used to measure the impedance of many circuits in the resistance welding loop. It is important that the circuit which is to be measured with the impedance meter 10 is properly "short-circuited" by the operator as will be described. "Short-circuited" refers to electrically closing the circuit (loop) which is to be measured. To insure accurate and consistent readings, the operator should also clean all contact surface within the circuit to be measured. Such surfaces include the gun tip surfaces, the current adaptor surfaces, the shorting bar surfaces, and the transformer connecting surfaces such as pads or lugs. The recommended method of cleaning such surfaces is with an abrasive cloth such as that sold under the trademark SCOTCHBRIGHT by 3M Corporation. This cloth will remove dirt and copper oxides which form when copper is exposed to air.

FIG. 2 illustrates the use of the present impedance meter 10 in measuring the impedance of a welding gun and transformer. The first step is to "short-circuit" the transformer with a jumper 110. Preferably, the shorting bar is constructed of 100-percent-conductivity copper commensurate with the conductor which would be used to power the transformer. The jumper 110 is coupled across the primary connections 112 of the transformer 114 enabling the total impedance of the welding gun and transformer to be measured at one time. The current lead clip 52 is inserted between the tips 116 of the welding gun 118, and the tips are clamped down on the clip 52 to engage the opposite current adapters 54 and 56. The clamping force may be produced through the gun's hydraulic or pneumatic cylinder 120 or by mechanically placing the tips together with an external clamp. The voltage lead clips 72 are attached to the holes located in the flared end on the current adapters 54 and 56.

After the described electrical connections have been made, the dial 30 is rotated to the fully counterclockwise position to turn the variac 92 fully off. The power switch 82 is then manually closed to provide power to the meter 10. The dial is then rotated clockwise and adjusted as necessary until the set point display 32 displays the number 1.00 indicating that precisely 100 amps are flowing through the welding gun and transformer. The voltage in millivolts multiplied by 10 is displayed on the display 34. Because the impedance is identical to the displayed voltage at the described current level, the display 34 also displays the impedance of the circuit in micro-ohms.

The set point current as described is 100 amps. Preferably, the set point current is $10^k$ amps where k is any integer—negative, zero, or positive. When the current is so set, the voltage and therefore impedance of the circuit can be read directly from the voltage meter without further calculation, thereby simplifying use and reading of the meter. Although impedance meters which do not use the described amperage values fall within the scope of the present invention, they are considered not as desirable since a calculation—either manual or digital—is required to ascertain the impedance.

Further, the described amperage range is believed to be ideal for purposes of testing resistance welding circuits. Based on tests performed by the inventors, set points below 75 amps result in unstable voltages and impedances. Consequently, a set point of 100 amps is the "first" $10^k$ voltage in the "linear" range and therefore is most easily and safely generated.

As will be readily appreciated, the impedance meter can be used to measure the impedance of virtually any resistance welding apparatus between any two points. In particular, the meter can measure the 60-hertz impedance of single phase AC resistance welding machines, portable welding guns, transguns with transformer, transguns without transformer, and "kickless" cables. The meter can also be used to measure the 60-hertz impedance of single-phase AC welders from welding tip to power connection in the welding controls; to determine tip-to-tip short circuit current of single-phase AC resistance welders; to troubleshoot single-phase AC resistance welders; to check for current shunting in resistance welding tools (i.e. decrease of original impedance); and to check for deterioration of resistance welding tools (increase of original impedance).

For example, and to clarify the above, the impedance of a resistance welding gun can be measured by closing the gun tips on the current lead clip 52 and shunting the gun secondary connection surfaces. The impedance of a gun can also be measured by closing the gun tips on themselves, disconnecting the current leads 50 from the connector clip 52, and connecting the current leads to the gun secondary connection surfaces. The impedance of a resistance welding transformer can be measured by disconnecting the current leads 50 from the current clip 52, connecting the current leads to the transformer secondaries, and shunting the transformer primary connections.

The set point can be used as a devisor in an "indirect" method of determining impedance. This is accomplished by rotating the set point adjustment dial 30 until a set point other than 1.00 is obtained. As noted above, for the most accurate reading, a set point value greater than 0.75 should be used. The set point value is then used as the devisor and the micro-ohm display 34 is used as the numerator. For example, a set point read out of 0.75 and a micro-ohm read out of 375 would produce a calculated impedance of 500 micro-ohms (i.e. 375 divided by 0.75.

Conclusion

The above description is that of a preferred embodiment of the invention. Various alterations and changes can be made without departing from the spirit and broader aspects of the invention as set forth in the appended claims, which are to be interpreted in accordance with the principles of patent law including the doctrine of equivalents.

The embodiments of the invention in which an exclusive property or privilege is claimed are defined as follows:

1. An impedance meter for closely approximating the impedance of a resistance welding apparatus between first and second points thereon, said meter comprising:
   current supply means for supplying an alternating current of a preselected amperage;
   conductor means for conducting the current from said current supply means to the first and second points of the resistance welding apparatus;
   voltage meter means for measuring the voltage across the first and second points of the welding apparatus when the current is conducted therethrough; and
   display means for displaying a number dependent on the measured voltage, said number being indicative of the impedance of said welding apparatus.

2. An impedance meter as defined in claim 1 wherein said current supply means includes:
   a current meter means for providing an indication of the current supplied by said current supply means; and
   a control means for enabling the preselected amperage to be manually selected as determined from said current meter means.

3. An impedance meter as defined in claim 1 wherein said preselected amperage is $10^k$, where k is any integer.

4. An impedance meter as defined in claim 3 wherein $k=2$, whereby the amperage equals 100 amps.

5. An impedance meter as defined in claim 1 wherein said conductor means includes a connector clip having a pair of conductors with an insulator therebetween, whereby the tips of a resistance welding gun can be closed against said pair of conductors while said insulator prevents electrical contact between said conductors.

6. An impedance meter as defined in claim 1 wherein said current supply means includes a variac.

7. A portable impedance meter for use with resistance welding apparatus comprising:
   a case;
   a power cord extending from said case to be connected to a source of conventional alternating current;
   a pair of current leads extending from said case to be connected to a pair of points on a resistance welding apparatus between which an impedance is to be measured;
   a pair of voltage leads extending from said case to be connected to the pair of points on the resistance welding apparatus;
   current meter means for displaying the amount of current supplied to said current leads;
   control means for controlling the level of current supplied to said current leads to a selected level as read on said current meter means; and
   voltage meter means connected to said voltage leads for displaying the voltage thereacross, thereby providing an indication of the impedance of the resistance welding apparatus between the points.

8. A portable impedance meter as defined in claim 7 wherein said control means is manually operable.

9. A portable impedance meter as defined in claim 7 wherein the selected level is $10^k$ amps where k is any integer.

10. A portable impedance meter as defined in claim 7 wherein said current leads include a connector clip having a pair of contacts and an insulator therebetween, whereby the welding tips of a resistance welding gun can be closed on said connector clip against said contacts with said insulator preventing electrical contact between said contacts.

11. A portable impedance meter as defined in claim 7 wherein said control means includes a variac.

12. A method of determining the impedance of a resistance welding device between first and second points, said method comprising:
   electrically connecting conductor means, for conducting current, to the first and second points;
   conducting an alternating current of a preselected level through the conductor means and thereby through the device between the first and second points;
   measuring the voltage across the first and second points while the current of a preselected level is flowing therethrough; and
   displaying a result dependent on the measured voltage and indicative of the impedance between the first and second points.

13. A method as defined in claim 12 wherein said conducting step includes manually adjusting an electrical component to achieve said preselected level as observed on a current meter.

14. A method as defined in claim 12 wherein the preselected level is $10^k$ amps where k is any integer.

15. A method of approximating the impedance of a resistance welding apparatus comprising:
   conducting current of a known amperage between first and second points of the welding apparatus, the known amperage being $10^k$ where k equals any integer; and
   measuring the voltage across the first and second points while the current of known amperage is flowing therethrough, whereby the voltage closely approximates the impedance.

16. A method as defined in claim 15 wherein $k=2$, whereby the known amperage is 100 amps and the impedance between the first and second points is equal to the voltage.

* * * * *